United States Patent
Lin et al.

(10) Patent No.: US 11,380,673 B2
(45) Date of Patent: *Jul. 5, 2022

(54) ELECTROSTATIC DISCHARGE DEVICE

(71) Applicant: Taiwan Semiconductor Manufacturing Co., Ltd., Hsin-Chu (TW)

(72) Inventors: Wun-Jie Lin, Hsinchu (TW); Han-Jen Yang, Taipei (TW); Yu-Ti Su, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/107,694

(22) Filed: Nov. 30, 2020

(65) Prior Publication Data

US 2021/0082907 A1    Mar. 18, 2021

Related U.S. Application Data

(63) Continuation of application No. 16/219,747, filed on Dec. 13, 2018, now Pat. No. 10,854,595, which is a
(Continued)

(51) Int. Cl.
*H01L 27/02* (2006.01)
*H01L 29/66* (2006.01)
(Continued)

(52) U.S. Cl.
CPC .... *H01L 27/0266* (2013.01); *H01L 21/28123* (2013.01); *H01L 21/823431* (2013.01);
(Continued)

(58) Field of Classification Search
CPC ... H01L 29/10; H01L 29/109; H01L 29/1095; H01L 29/66; H01L 29/665;
(Continued)

(56) References Cited

U.S. PATENT DOCUMENTS

| 6,563,175 | B2 | 5/2003 | Shiau et al. |
| 7,932,563 | B2 | 4/2011 | Ho et al. |
(Continued)

FOREIGN PATENT DOCUMENTS

| CN | 101136435 | 3/2008 |
| CN | 104051249 | 9/2014 |
(Continued)

OTHER PUBLICATIONS

Korean IPO, Office Action dated Aug. 28, 2015, issued in Patent Application No. 10-2013-0144629, 6 pages, translation 4 pages.

*Primary Examiner* — Monica D Harrison
(74) *Attorney, Agent, or Firm* — Haynes and Boone, LLP

(57) ABSTRACT

An Electro-Static Discharge (ESD) includes a first well having a first conductivity type on a substrate. The device further includes a second well within the first well. The second well has a second conductivity type. The device further includes a third well within the first well. The third well has the second conductivity type. The device further includes a first gate device disposed over the first well, a plurality of active regions between the first gate device and the dummy gate, and a dummy gate disposed within a space between the active regions. The dummy gate is positioned over a space between the second and third wells.

20 Claims, 10 Drawing Sheets

Related U.S. Application Data continuation of application No. 15/670,356, filed on Aug. 7, 2017, now Pat. No. 10,157,905, which is a continuation of application No. 15/262,588, filed on Sep. 12, 2016, now Pat. No. 9,728,531, which is a continuation-in-part of application No. 13/932,521, filed on Jul. 1, 2013, now Pat. No. 9,443,850.

(60) Provisional application No. 61/779,842, filed on Mar. 13, 2013.

(51) Int. Cl.

| | | |
|---|---|---|
| *H02H 9/04* | (2006.01) | |
| *H01L 27/088* | (2006.01) | |
| *H01L 29/10* | (2006.01) | |
| *H01L 21/8234* | (2006.01) | |
| *H01L 23/60* | (2006.01) | |
| *H01L 21/28* | (2006.01) | |

(52) U.S. Cl.
CPC ...... *H01L 21/823437* (2013.01); *H01L 23/60* (2013.01); *H01L 27/0207* (2013.01); *H01L 27/0292* (2013.01); *H01L 27/0886* (2013.01); *H01L 29/1095* (2013.01); *H01L 29/66545* (2013.01); *H02H 9/046* (2013.01)

(58) Field of Classification Search
CPC ........... H01L 29/6654; H01L 29/66545; H01L 27/02; H01L 27/02; H01L 27/0207; H01L 27/026; H01L 27/0266; H01L 27/029; H01L 27/0292; H01L 27/08; H01L 27/088; H01L 27/0886; H01L 23/60; H01L 21/28; H01L 21/281; H01L 21/2812; H01L 21/28123; H01L 21/82; H01L 21/823; H01L 21/8234; H01L 21/82343; H01L 21/823431; H01L 21/823437
USPC ........................................................ 257/360
See application file for complete search history.

(56) References Cited

U.S. PATENT DOCUMENTS

| | | | |
|---|---|---|---|
| 8,533,639 B2 | 9/2013 | Lin et al. | |
| 8,912,606 B2 | 12/2014 | Baldauf et al. | |
| 9,209,183 B2 * | 12/2015 | Tsai | H01L 29/7835 |
| 9,728,531 B2 | 8/2017 | Lin et al. | |
| 10,854,595 B2 * | 12/2020 | Lin | H01L 27/0292 |
| 2003/0057496 A1 | 3/2003 | Shiau et al. | |
| 2006/0163665 A1 | 7/2006 | Chuang et al. | |
| 2010/0193870 A1 | 8/2010 | Ho et al. | |
| 2011/0287611 A1 | 11/2011 | Cheng et al. | |
| 2015/0028421 A1 | 1/2015 | Reinprecht | |
| 2017/0047317 A1 | 2/2017 | Lin et al. | |
| 2019/0131293 A1 | 5/2019 | Lin et al. | |

FOREIGN PATENT DOCUMENTS

| | | |
|---|---|---|
| CN | 104160509 | 11/2014 |
| KR | 1020090022766 | 3/2009 |
| KR | 20140058323 | 5/2014 |
| KR | 20140071851 | 6/2014 |
| KR | 20150118059 | 10/2015 |

\* cited by examiner

ELECTROSTATIC DISCHARGE DEVICE

PRIORITY INFORMATION

This application is a continuation of U.S. application Ser. No. 16/219,747 filed Dec. 13, 2018 and entitled "Improved Electrostatic Discharge Device," which is a continuation of U.S. application Ser. No. 15/670,356 filed Aug. 7, 2017 and entitled "Improved Electrostatic Discharge Device," which is a continuation of U.S. application Ser. No. 15/262,588 filed Sep. 12, 2016, and entitled "Improved Electrostatic Discharge Device," which is a continuation-in-part of U.S. application Ser. No. 13/932,521 filed Jul. 1, 2013 and entitled "Epitaxial Growth Between Gates," which claims the benefit of U.S. Provisional Application No. 61/779,842 filed on Mar. 13, 2013, the disclosures of which are hereby incorporated by reference in the entirety.

BACKGROUND

Electronic devices that utilize integrated circuits are susceptible to electrostatic discharges (ESDs). An electrostatic discharge may occur from a human holding the device or other source. An electrostatic discharge can pass a large amount of electric current through circuitry that is sensitive to such high currents, thus damaging the circuitry. To reduce the susceptibility to ESD damage, integrated circuits typically include an ESD device that channels ESDs away from sensitive circuitry.

One type of ESD device involves multiple active regions, such as source or drain regions, between an elongated gate device. The gate device is used for the gate of a transistor. The transistor acts as a switch that opens when a high electric current such as an ESD is detected. The open switch allows the ESD passes through in order to avoid flowing through the sensitive circuitry.

One issue involved in forming an ESD device comes from silicide. When forming transistor devices, a silicide material is commonly used at semiconductor-metal junctions to facilitate an efficient junction. This is because silicide conducts electric current relatively well. However, it is desirable that the silicide is not formed over the source or drain regions adjacent to the gate. If silicide layers were to be formed there, the current flowing through the source and drain regions would tend to travel mostly through the silicide, which may cause damage because the current density resulting from the high ESD currents may burn away the silicide and surrounding material.

Another issue involving the formation of ESD devices arises when the source drain regions are formed through an epitaxial growth process. An epitaxial growth process involves growing a semiconductor crystal onto an existing crystal. When forming source or drain regions in such a manner, the length of the regions can affect the uniformity of the epitaxial grown structures. If a structure is too long compared to other nearby structures, a set of non-uniform epitaxially grown structures may be formed. This is referred to as the loading effect. It is thus desirable to fabricate ESD devices, or other devices that utilize epitaxially grown active regions between gates, without too much of an adverse loading effect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
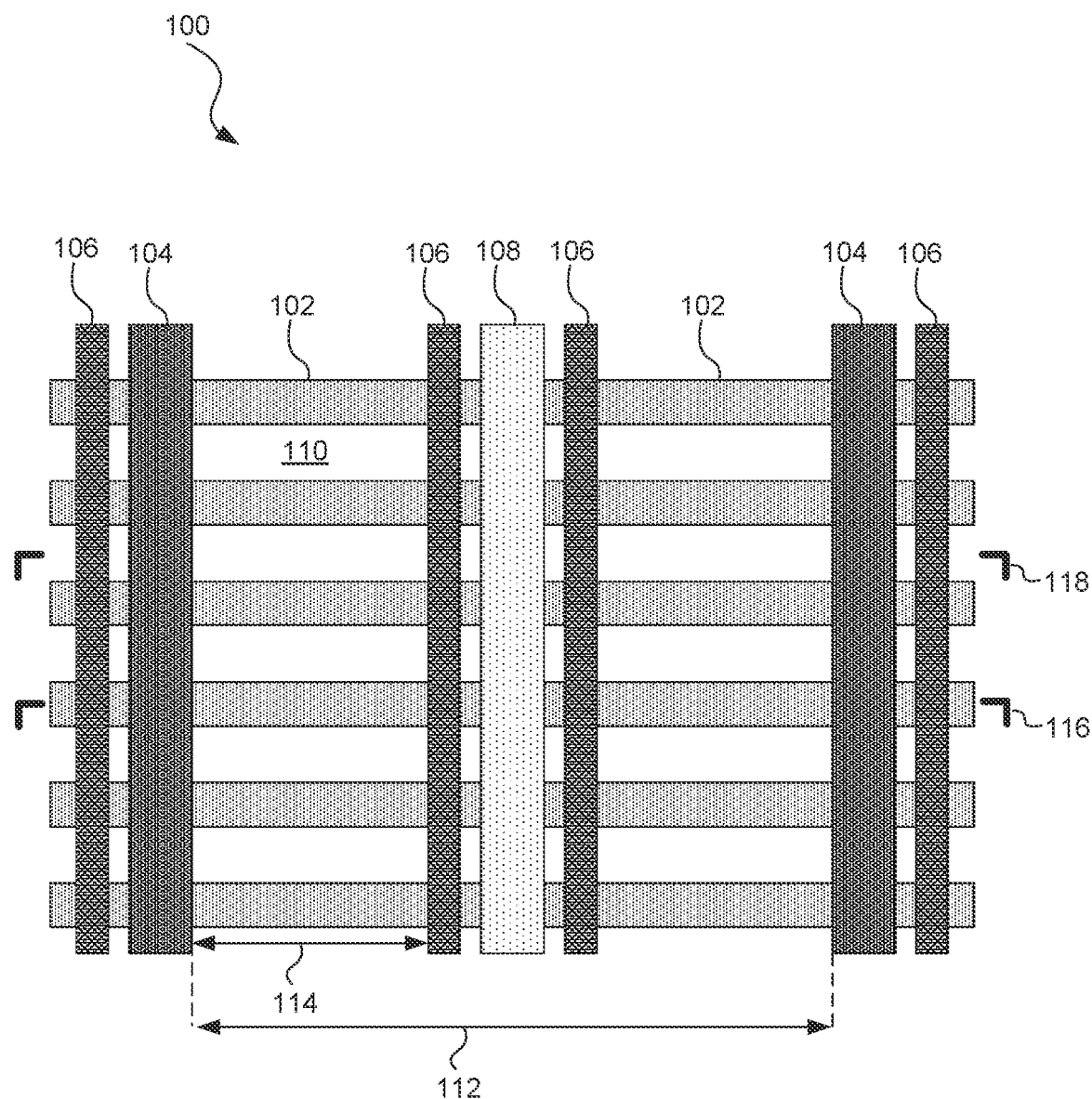
FIG. 1 is a diagram showing an illustrative top view of epitaxial growth between gates, according to one example of principles described herein.

FIG. 1 is a diagram showing an illustrative top view 100 of epitaxial growth between gates. According to certain illustrative examples, an integrated circuit device includes at least two gate device 104. The device includes active regions 102 between the two gate devices 104. Additionally, at least one dummy gate 108 is placed within the middle of the two gate devices 104. Metal contacts 106 may also be formed adjacent to the gate devices 104 and dummy gate 108.

According to the present example, the active regions 102 may be formed within a well 110. As mentioned above, the active regions 102 can be formed through an epitaxial process. Such a process involves the deposition of a crystalline overlayer onto a crystalline substrate. For example, the active region structures 102 may be formed onto a silicon substrate.

The active regions 102 may be n-type doped or p-type doped. The doping may occur in-situ with the epitaxial formation. Alternatively, a non-doped epitaxial structure may be formed. Then, a doping process may dope the epitaxially grown structures 102. The type of well 110 will depend on the type of dopant. For example, if the active regions 102 are to be n-type, then the well 110 in which the n-type active regions are formed is a p-type well. Conversely, if the active regions 102 are to be p-type, then the well 110 in which the p-type active regions are formed will be an n-type well. The active regions 102 are substantially uniform in length. The length refers to the long dimension between a real gate 104 and the dummy gate 108.

The gate structures 104, 108 may be formed with the same mask. Specifically, a gate layer may be deposited and patterned using standard photolithographic techniques. Specifically, a photoresist layer may be exposed to a light source through a photomask. Regions of the photoresist layer may then be developed away. The remaining photoresist layer acts as a protection from an etching process. The etching process may remove the gate material at all regions where the gates are not intended to be formed. The gate material that was protected by the photoresist layer thus leaves the gate devices 104, 108 intact.

In some examples, the gate devices 104 and the dummy gate 108 may be formed using the same mask and may thus be made out of the same material. The gate devices 104 may be used as gate terminals for a transistor device of an ESD device. The dummy gate 108 may be left as is and is not used for any transistor device. In some cases, the dummy gate 108 may be biased. Alternatively, the dummy gate 108 may be floated. That is, it is not connected to anything, including ground.

The placement of the dummy gate 108 is such that the epitaxial window is reduced. The epitaxial window refers to the length of the epitaxial structures. If there were no dummy gate 108 in place, the epitaxial window would be relatively long as indicated by the line 112. With the dummy gate 108 in place, however, the epitaxial window is reduced as indicated by the line 114. Thus, the epitaxial window 114 on both sides of the dummy gate is substantially the same and smaller. This allows for a more uniform epitaxial process.

Figure 2A:
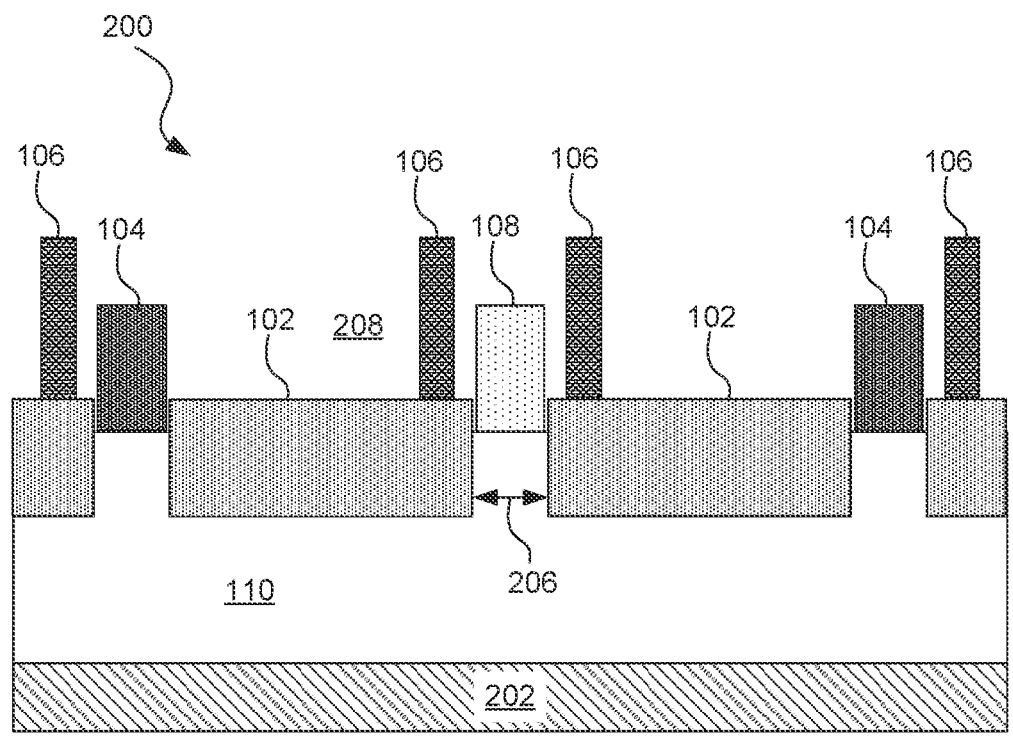
FIG. 2A is a diagram showing an illustrative cross-sectional view of an ESD device with epitaxial growth between gates, according to one example of principles described herein
Figure 2B:
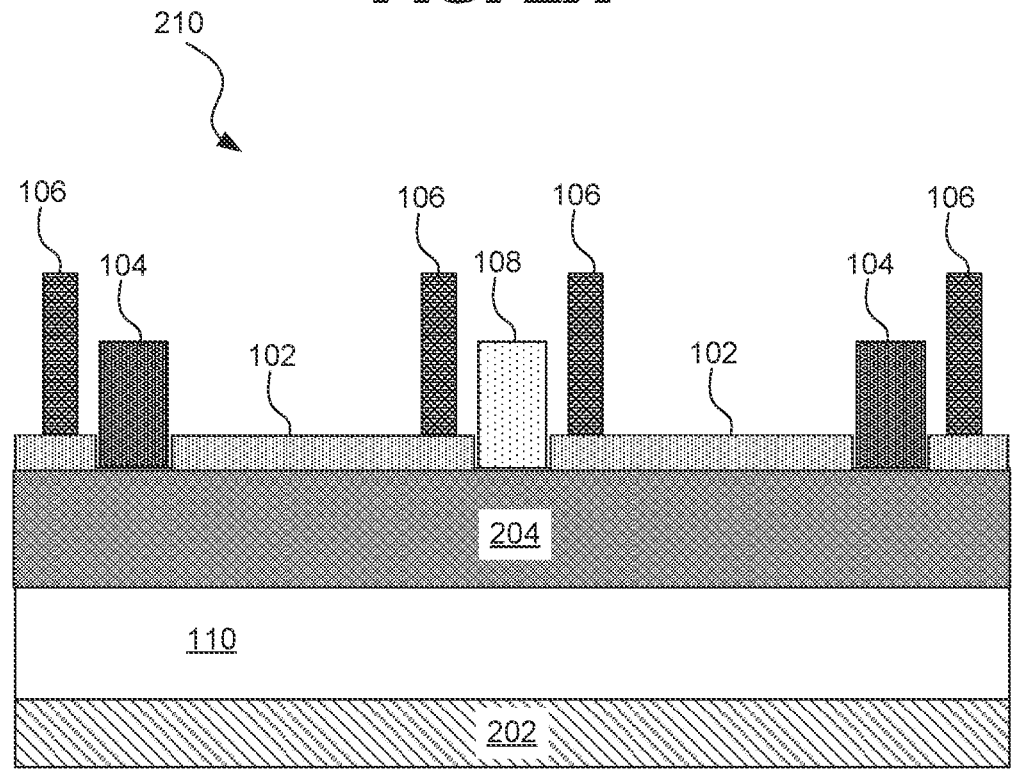
FIG. 2B is a diagram showing an illustrative cross-sectional view of an ESD device with epitaxial growth between gates, according to one example of principles described herein.

The brackets 116, 118 represent cross sections of the device. The first bracket 116 represents a cross-section along a fin structure as illustrated in FIG. 2A. The second bracket 118 represents a cross section between the fin structures as illustrated in FIG. 2B.

FIG. 2A is a diagram showing an illustrative cross-sectional view 200 of an ESD device with epitaxial growth between gates. According to the present example, the active regions 102 are shown as being formed into the well 110. The well 110 may be formed on top of a base substrate 202. The base substrate 202 may be made of a semiconductor material such as silicon.

The spaces 206 between the active regions 102 are where the gates 104, 108 are formed. As described above, the dummy gate 108 is placed in between the two normal gates 104. The dummy gate 108 reduces the epitaxial window and allows for more uniform active region structures 102.

As mentioned above, contacts 106 may be formed adjacent to the gates 104, 108. The contacts 106 are used to connect the gate devices to the active regions. In the case of the actual gates 104, the contacts connect the source or drain regions to a source or drain terminal. This is typically done on an overlaying metal layer (not shown). Specifically, an interlayer dielectric layer 208 may be formed on top of the gate devices.

Vias are then formed into the interlayer dielectric layer 208. The vias extend down to the substrate regions. A silicide material is then formed within the vias. The vias are then filled with a metal material to form the contacts 106. Forming the contacts in such a manner is referred to as a silicide last process. After the contacts 106 have been formed into the interlayer dielectric layer 208, a metal layer can be formed on top that connects the contacts 106 to other devices.

Similar procedures may be used to connect the gate devices 104 to other elements within the integrated circuit. Specifically, vias may be formed into the interlayer dielectric layer 208 that extend down to the gate devices 104. These vias are then filled with silicide and then with metal. In some cases, the vias that extend to the gate devices 104 may extend from a different layer than the layer that uses the contacts 106 to connect with the active regions 102.

FIG. 2B is a diagram showing an illustrative cross-sectional view of an ESD device with epitaxial growth between gates and between fin structures. According to the present example, the space between parallel active regions may be a shallow trench isolation material. Such a material is a dielectric material such as silicon dioxide in order to prevent electric current from passing between devices.

The shallow trench isolation structures 204 may be formed in a variety of ways. In one example, trenches are etched into the underlying material, in this case the well 110. The trenches are then filled with the dielectric material to form the shallow trench isolation 204. These trenches are patterned using standard photolithographic techniques. From this cross-sectional view, the active regions 102 are still visible because they extend about the shallow trench isolation feature 204.

Figure 3A:
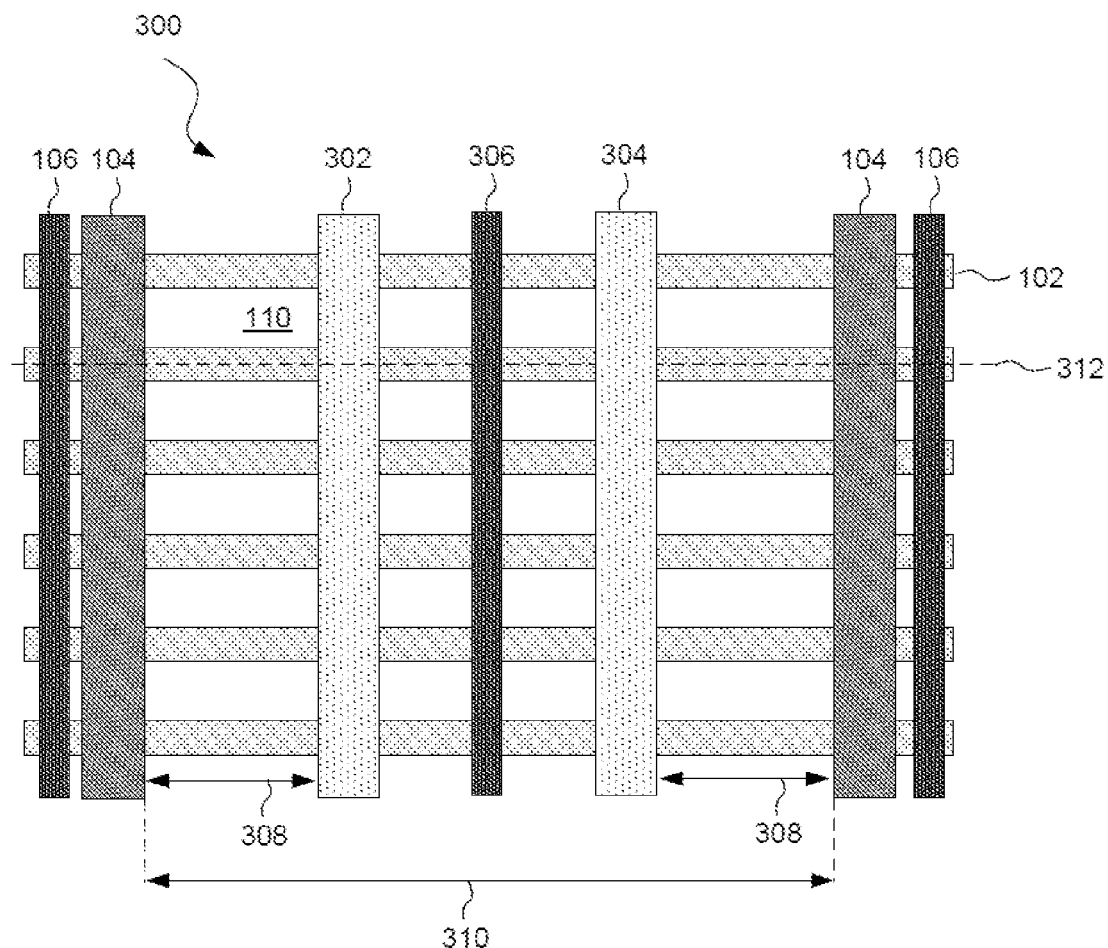
FIG. 3A is a diagram showing an illustrative top view of epitaxial growth between gates, including multiple dummy gates, according to one example of principles described herein.

FIG. 3A is a diagram showing an illustrative top view 300 of epitaxial growth between gates, including multiple dummy gates. According to the present example, more than one dummy gate may be placed between the two real gates 104. Specifically, two dummy gates 302, 304 are placed between the real gates 104.

The dummy gates are spaced so that the active regions between each gate structure 104, 302, 304 are substantially equal in length. Thus, the epitaxial window 308 is approximately equal in length for each active region. By reducing the size of the epitaxial window 308 and maintaining a uniform length among the active regions, the loading effect can be reduced. As mentioned above, the loading effect occurs when an epitaxial growth process is performed at multiple regions on a substrate. If these regions vary in size, then some regions will experience the growth slightly different than other regions. This non-uniformity can have adverse effects on the integrated circuit.

The number of dummy gates and thus size of the epitaxial window can be selected to reduce the loading effect below a threshold level. That threshold level may be predetermined during the design phase or may be determined during the fabrication phase. The epitaxial windows between gates are defined by the following equation:

$$Wd=(W-n*L)/(n+1)$$

Where:
Wd is the reduced epitaxial window 308;
W is the original window 310 between the real gates 104
n is the number of dummy gates; and
L is the width of the dummy gates.

The epitaxial window 308 may be fine tuned by selecting the number of dummy gates and the size of the window 310 between the real gates 104. Having the dummy gates 304, 302 allows for more control over the epitaxial window 308 and thus the ESD device may be optimized by adjusting the window 308. In general, the ESD device performs better when a higher electric current can pass through the transistor.

Figure 3B:
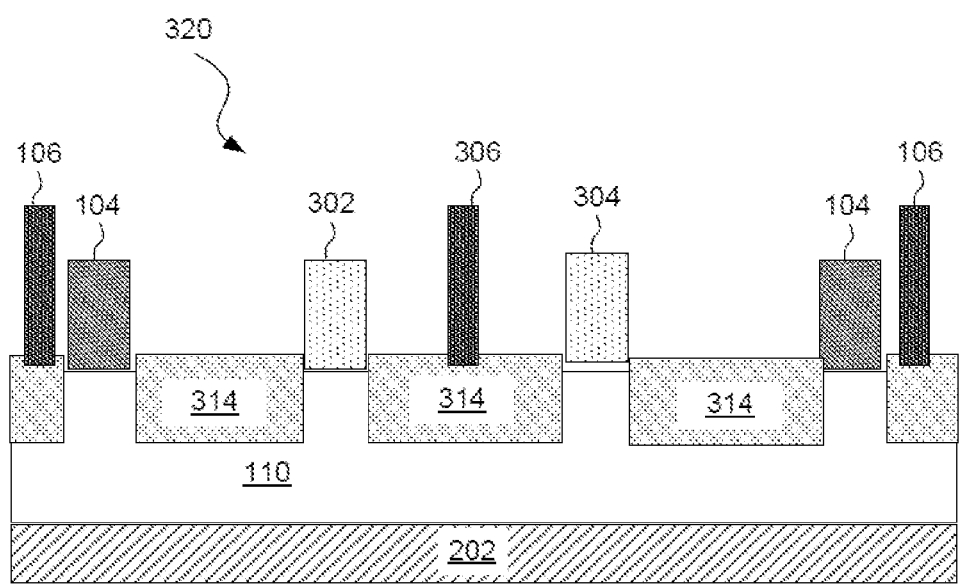
FIG. 3B is a diagram showing a cross-sectional view of epitaxial growth between gates, including multiple dummy gates, according to one example of principles described herein.

FIG. 3B is a diagram showing a cross-sectional view 320 of epitaxial growth between gates, including multiple dummy gates. The cross-sectional view 320 is along a fin structure as represented by the bracket 312 in FIG. 3A. According to the present example, the active regions may be formed as described above.

In this example, instead of having a contact on each side of the dummy gate as illustrated in FIG. 1 and FIGS. 2A-2B, only a single contact 306 is positioned between the two dummy gates 302, 304. Other positions for contacts 306 may be used as well. In some examples, the contacts may be used to bias the dummy gates. In some examples, the contact 306 may be used for other circuit design purposes.

While a fin structure transistor is illustrated, the principles described herein may be used with conventional Complementary Metal Oxide Semiconductor (CMOS) architecture as well. For example, a standard active region may be epitaxially grown between gates and dummy gates instead of multiple fin active regions grown between the gates.

Having more uniform active regions between the gates can allow for a higher quality replacement gate process. In some cases, real gates are made of a polysilicon material and are then replaced with a metal material. This process involves forming sidewalls spacer on the sides of the polysilicon gate, removing the polysilicon, and then replacing the space left behind with a metal material.

The dummy gates 304, 302 may also be used to help with thermal dissipation. Because an ESD device is intended to handle higher electric currents, it will be subject to high temperatures due to electric current flowing through narrow structures. The dummy gates 304, 302 may act as a heat sink and thus keep the ESD device relatively cool.

Figure 4:
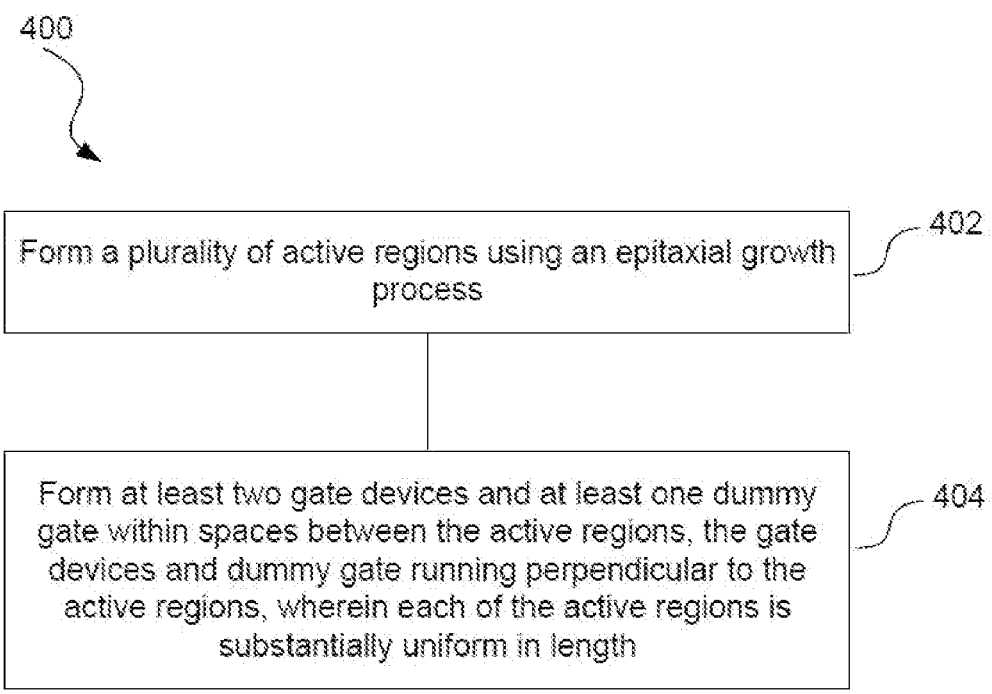
FIG. 4 is a flowchart showing an illustrative method for forming a device with improved epitaxial growth between gates, according to one example of principles described herein.

FIG. 4 is a flowchart showing an illustrative method for forming a device with improved epitaxial growth between gates. According to certain illustrative examples, the method includes a step of forming 402 a plurality of active regions using an epitaxial growth process. The method further includes a step of forming 404 at least two gate devices and at least one dummy gate within spaces between the active regions, the gate devices and dummy gate running perpendicular to the active regions, wherein each of the active regions is substantially uniform in dimensions.

Figure 5A:
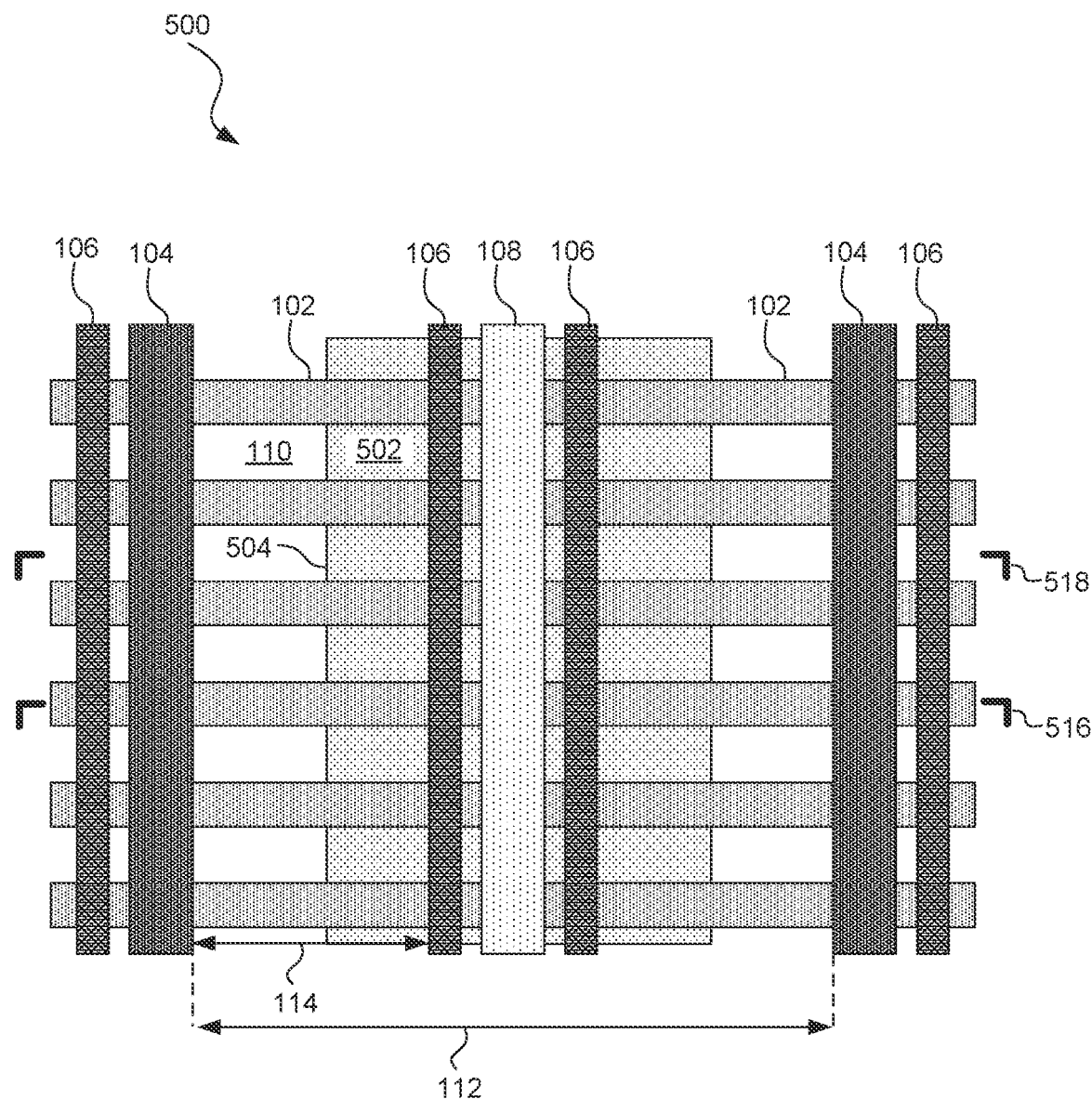
FIG. 5A is a diagram showing an illustrative top view of different types of wells positioned underneath epitaxial growth between gates, according to one example of principles described herein.

FIG. 5A is a diagram showing an illustrative top view 500 of different types of wells positioned underneath epitaxial growth between gates. In some examples, the performance of the ESD device may be improved by adding different types of wells underneath the device. For example, there may be two different types of wells, each different type of well having a different conductivity type. For example, one well may be a p-well and the other well may be an n-well. In one example, an n-well 502 may be formed within the p-well 110 as shown. The view illustrated in FIG. 5A shows the n-well 502 and the p-well 110 but does not show isolation regions that may be positioned between the active regions 102.

In some examples, the n-well 502 may be formed before the gate devices 104 and the dummy gate 108. The n-well 502 may be formed through various fabrication processes. For example, the n-well 502 may be formed through a doping process such as an ion implantation process. The n-well 502 may have a lighter doping concentration than the doping concentration of the active regions 102.

In some examples, the interface 504 between the n-well 502 and the p-well 110 may be positioned at a point between one of the gate devices 104 and the dummy gate 108. In some examples, the interface 504 may be closer to the gate devices 104 than the dummy gate 108. In some examples, the interface 504 may be closer to the dummy gate 108 than the gate devices 104.

Figure 5B:
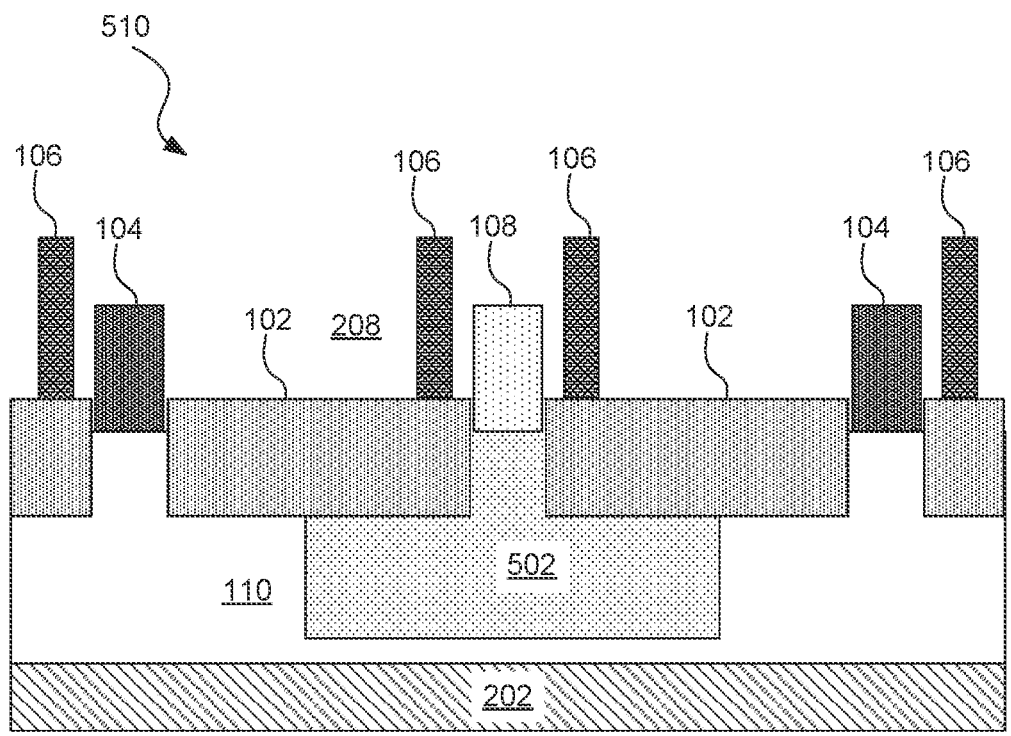
FIG. 5B is a cross-sectional view of the device shown in FIG. 5A through active regions, according to one example of principles described herein.

FIG. 5B is a cross-sectional view 510 of the device shown in FIG. 5A through the active regions. Specifically, the cross-sectional view is along line 516. As illustrated, the n-well 502 extends deeper than the active regions 102. However, the n-well 502 is not as deep as the p-well 110.

Figure 5C:
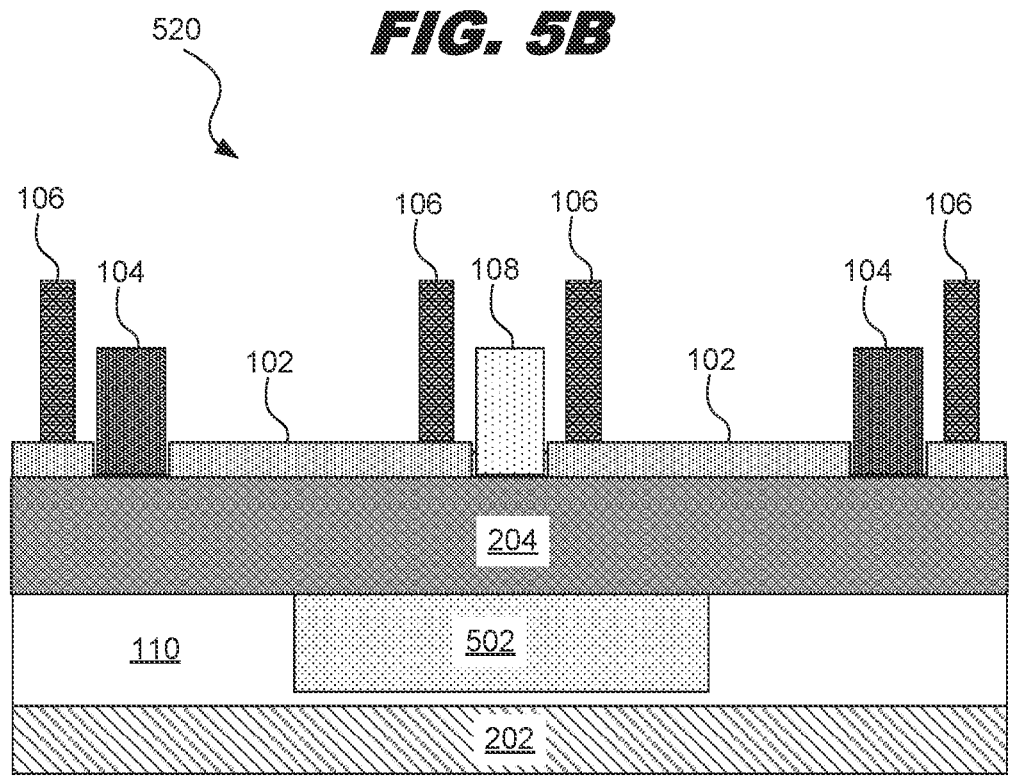
FIG. 5C is a cross-sectional view of the device shown in FIG. 5A through isolation regions, according to one example of principles described herein.

FIG. 5C is a cross-sectional view 520 of the device shown in FIG. 5A through isolation regions 204. Specifically, the cross-sectional view 520 is along line 518. As illustrated, the n-well 502 extends deeper than the isolation regions 204. In some examples, the n-well 502 is formed before the isolation regions 204 are formed.

Figure 6A:
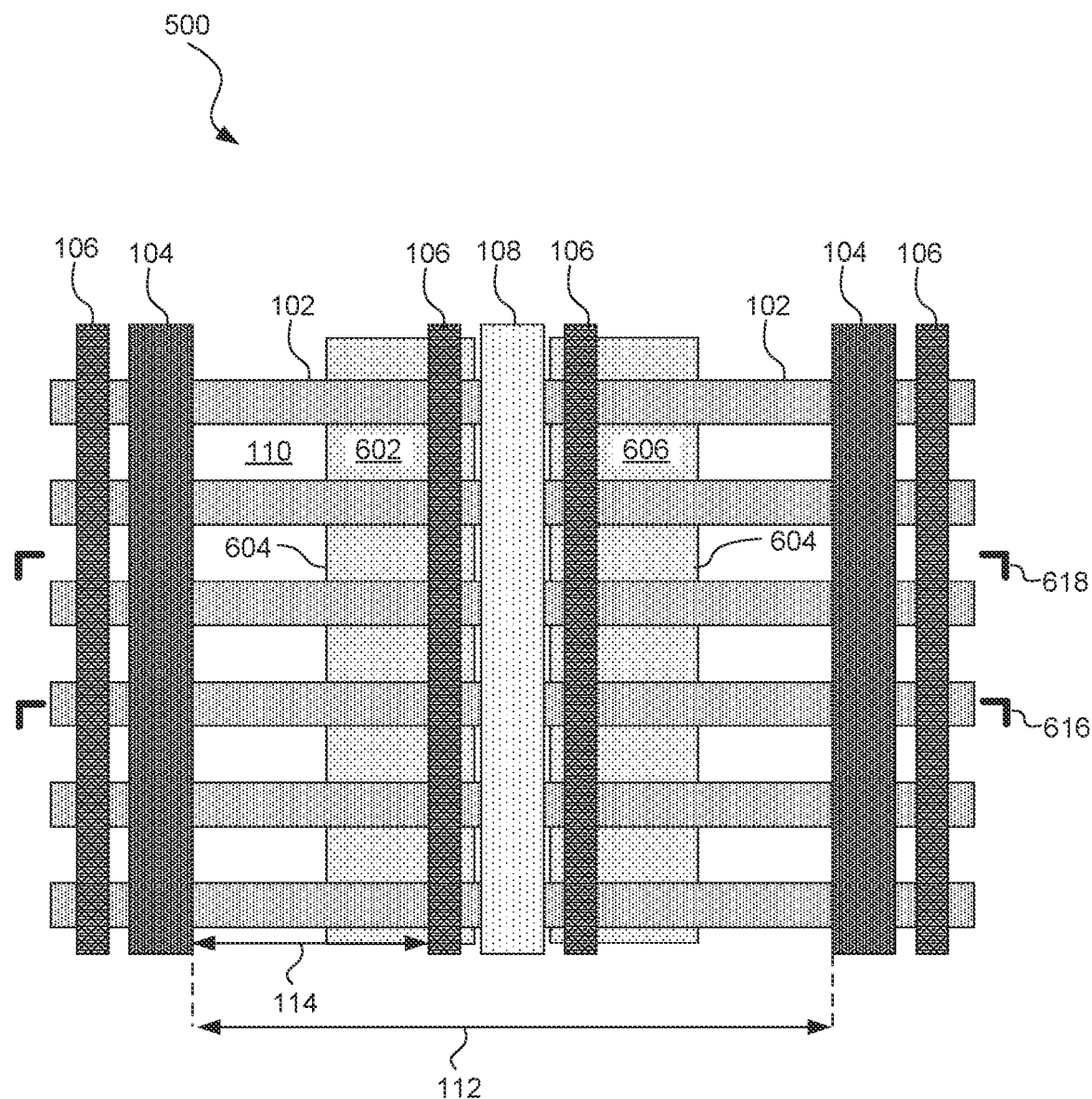
FIG. 6A is a diagram showing an illustrative top view of different types of wells positioned underneath epitaxial growth between gates, according to one example of principles described herein.

FIG. 6A is a diagram showing an illustrative top view 600 of different types of wells positioned underneath epitaxial growth between gates. In some examples, the performance of the ESD device may be improved by adding different types of wells underneath the device. For example, two separate n-wells 602 may be formed within the p-well 110. The n-wells 602 may be separated by a space beneath the dummy gate 108. The view illustrated in FIG. 6A shows the n-well 602 and the p-well 110 but does not show isolation regions that may be positioned between the active regions 102.

Figure 6B:
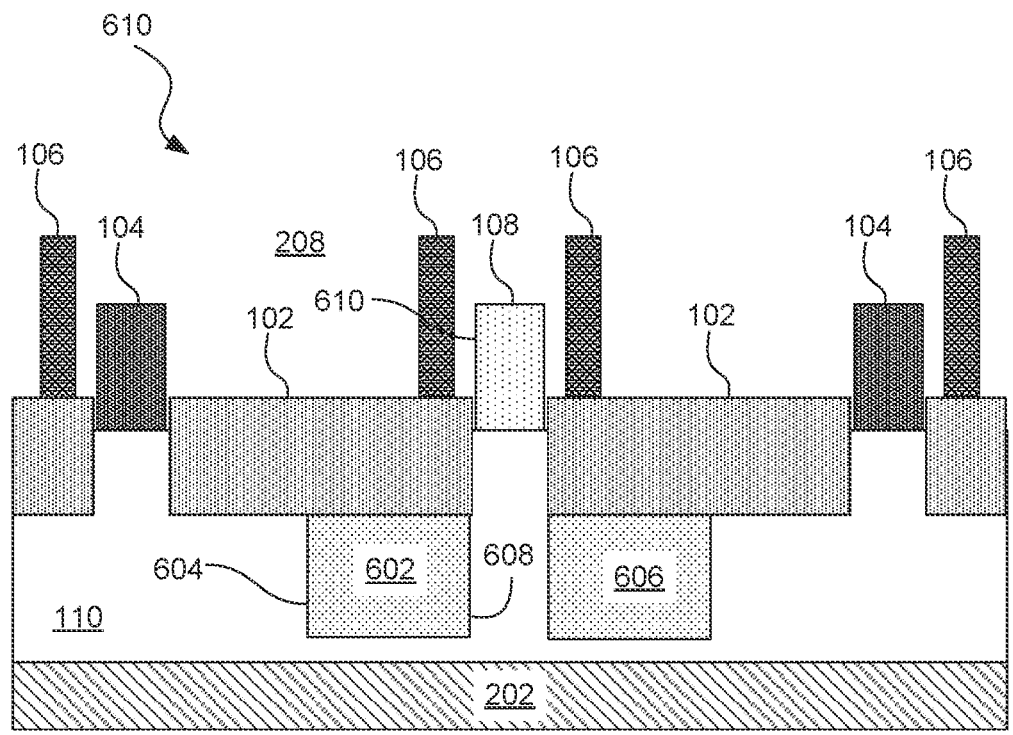
FIG. 6B is a cross-sectional view of the device shown in FIG. 6A through active regions, according to one example of principles described herein.

FIG. 6B is a cross-sectional view 610 of the device shown in FIG. 6A through the active regions 102. Specifically, the cross-sectional view is along line 616. As illustrated, the n-well 602 extends deeper than the active regions 102. However, the n-well 602 is not as deep as the p-well 110. In the present example, the outer interfaces 604 between the n-well 602 and the p-well 110 are at some point between the dummy gate 108 and the gate devices 104. The inner interfaces 608 are substantially aligned with the sidewalls of the dummy gate 108. Thus, the dummy gate 108 remains disposed over the p-well 110. In examples in which there are more than one dummy gate, there may be more than two n-wells 602. For example, if there are two dummy gates 108, then there may be a third n-well positioned between the two dummy gates.

Figure 6C:
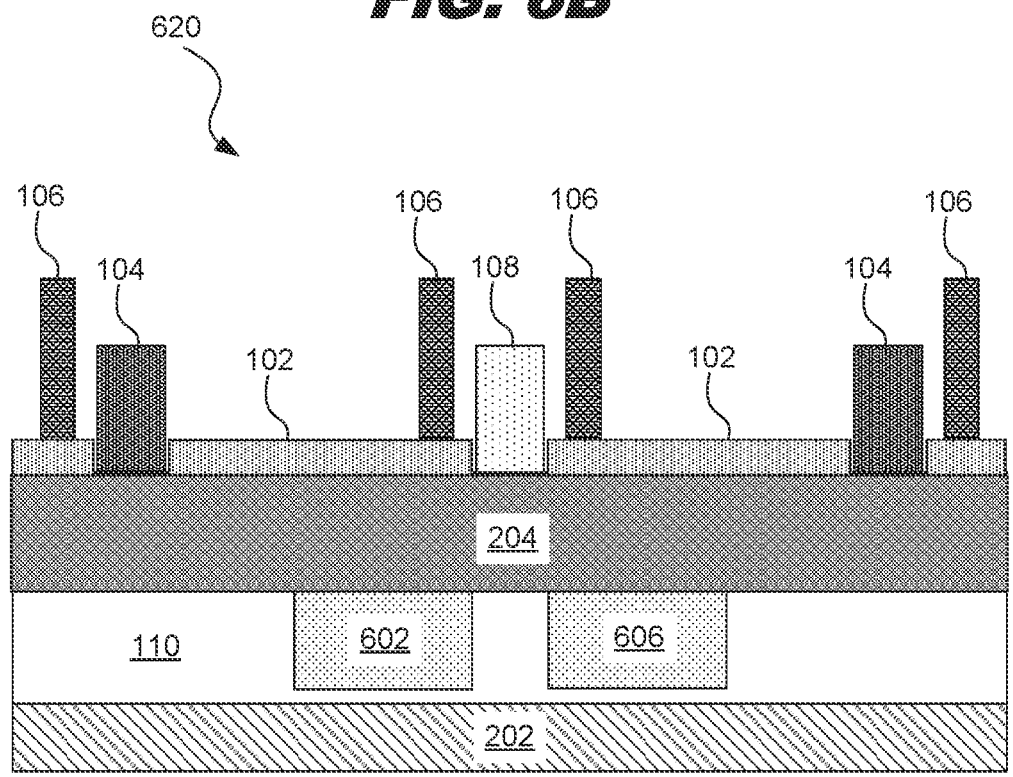
FIG. 6C is a cross-sectional view of the device shown in FIG. 6A through isolation regions, according to one example of principles described herein.

FIG. 6C is a cross-sectional view 620 of the device shown in FIG. 6A through isolation regions 204. Specifically, the cross-sectional view 620 is along line 618. As illustrated, the n-well 602 extends deeper than the isolation regions 204. In some examples, the n-well 602 is formed before the isolation regions 204 are formed.

Figure 7A:
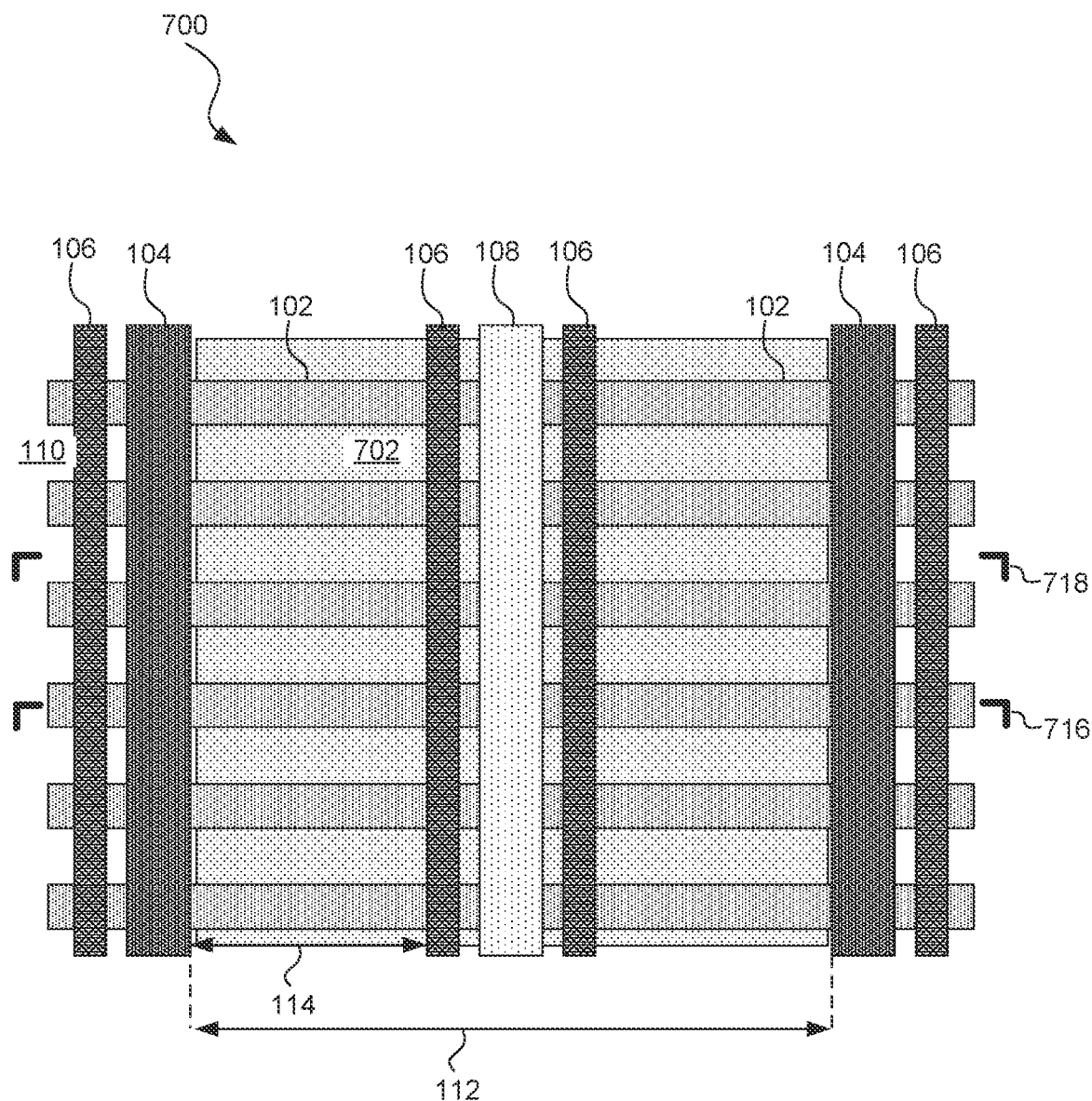
FIG. 7A is a diagram showing an illustrative top view of different types of wells positioned underneath epitaxial growth between gates, according to one example of principles described herein.

FIG. 7A is a diagram showing an illustrative top view of different types of wells positioned underneath epitaxial growth between gates. In some examples, the performance of the ESD device may be improved by adding different types of wells underneath the device. In the present example, the n-well 702 extends from one gate device 104 to the other gate device 104. The n-well 702 extends underneath the dummy gate 108 as well. The view illustrated in FIG. 7A shows the n-well 702 and the p-well 110 but does not show isolation regions that may be positioned between the active regions 102.

Figure 7B:
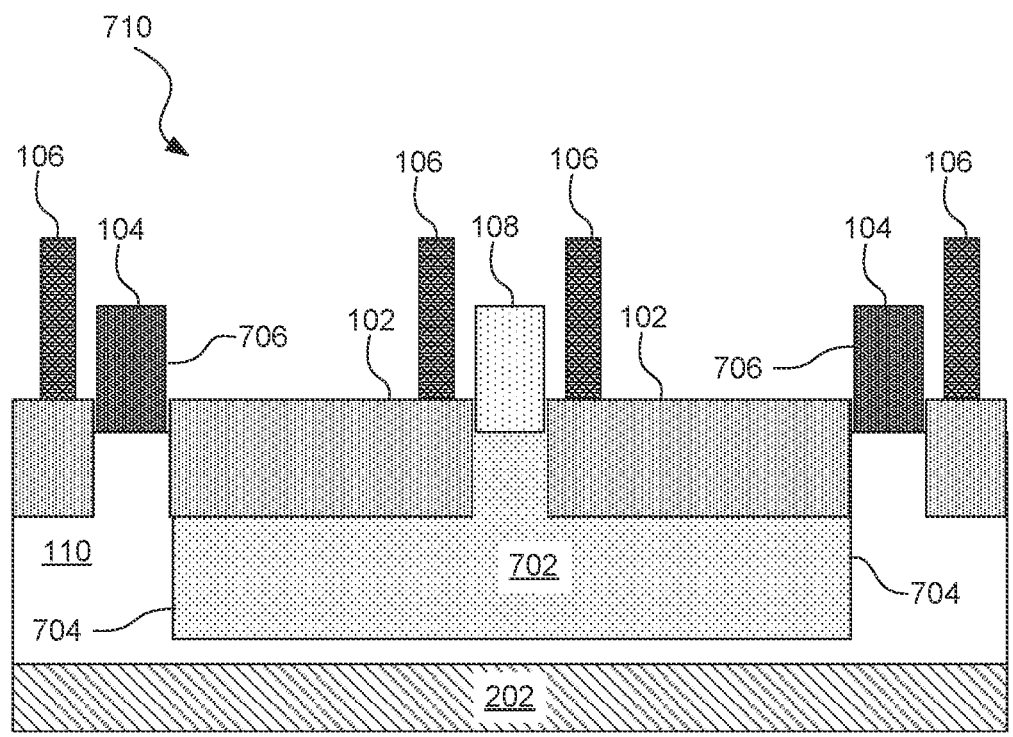
FIG. 7B is a cross-sectional view of the device shown in FIG. 7A through active regions, according to one example of principles described herein.

FIG. 7B is a cross-sectional view 710 of the device shown in FIG. 7A through the active regions 102. Specifically, the cross-sectional view is along line 716. As illustrated, the n-well 702 extends deeper than the active regions 102. However, the n-well 602 is not as deep as the p-well 110. In the present example, the interfaces 704 between the n-well 702 and the p-well 110 are substantially aligned with inner sidewalls 708 of the gate devices 104. Additionally, as shown, the n-well 702 extends underneath the dummy gate 108.

Figure 7C:
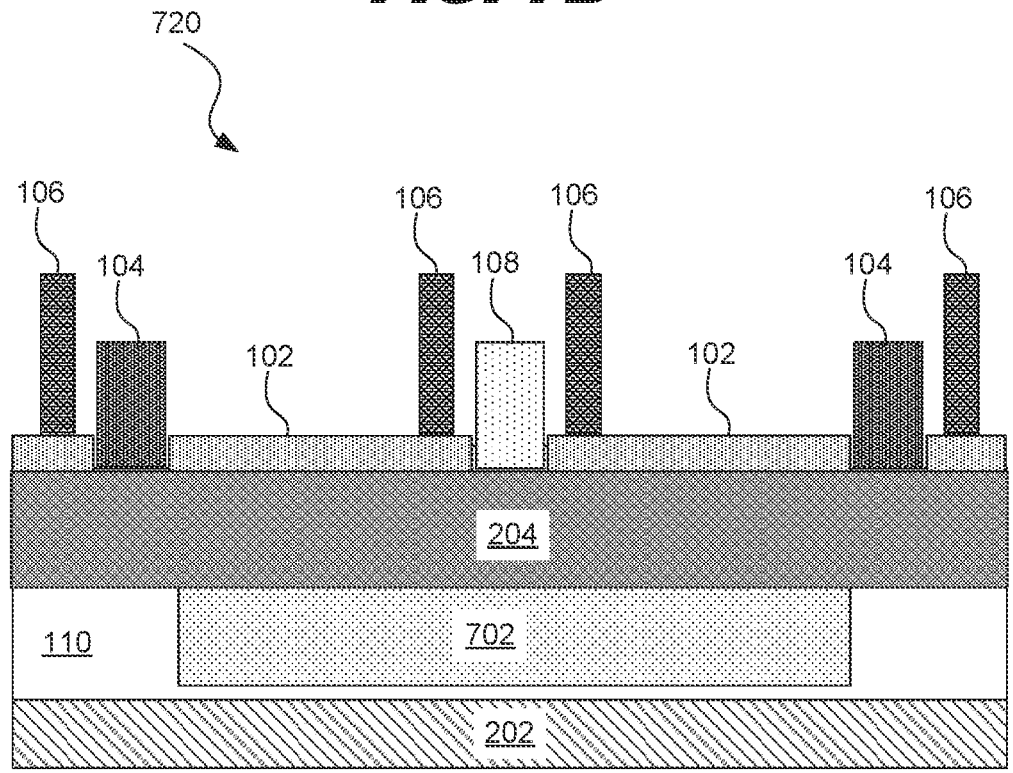
FIG. 7C is a cross-sectional view of the device shown in FIG. 7A through isolation regions, according to one example of principles described herein.

FIG. 7C is a cross-sectional view 720 of the device shown in FIG. 7A through isolation regions 204. Specifically, the cross-sectional view 720 is along line 718. As illustrated, the n-well 702 extends deeper than the isolation regions 204. In some examples, the n-well 702 is formed before the isolation regions 204 are formed.

According to one example, an integrated circuit device includes at least two epitaxially grown active regions grown onto a substrate, the active regions being placed between a first gate device and a second gate device. The integrated circuit device includes at least one dummy gate between the two epitaxially grown active regions and between the first gate device and the second gate device, wherein each active region is substantially uniform in length. The first gate device and the second device are formed over a first well having a first conductivity type and the dummy gate is formed over a second well having a second conductivity type.

According to one example, a method for forming an Electro-Static Discharge (ESD) device includes forming a first well having a first conductivity type on a substrate, forming a second well within the first well, the second well having a second conductivity type, forming a first gate device and a second gate device over the first well, forming a plurality of active regions between the first gate device and the second gate device, wherein each of the active regions is substantially uniform in length, and forming a dummy gate within a space between the active regions, the dummy gate being formed over the second well.

According to one example, an integrated circuit device includes at least two epitaxially grown active regions disposed on a substrate, the active regions being placed between a first gate device and a second gate device. The integrated circuit device further includes at least one dummy gate between the two epitaxially grown active regions and between the first gate device and the second gate device, wherein each active region is substantially uniform in length. The first gate device and the second device are formed over a first well having a first conductivity type and the dummy gate is formed over a space between a second well and a third well, the second well and the third well having a second conductivity type.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. An Electro-Static Discharge (ESD) device comprising:
   a first well having a first conductivity type on a substrate;
   a first gate device disposed over the first well;
   a second gate device disposed over the first well;
   a second well within the first well, the second well having a second conductivity type and extending between the first gate and the second gate;
   a plurality of active regions between the first gate device and the second gate; and
   a dummy gate disposed within a space between the active regions, the dummy gate being positioned over the second well.

2. The ESD device of claim 1, further comprising an interface between the first well and the second well, the interface being positioned under one of the active regions of the plurality of active regions.

3. The ESD device of claim 1, further comprising an interface between the first well and the second well, the interface being vertically aligned with a sidewall of the first gate device.

4. The ESD device of claim 1, wherein a doping concentration of the second well is different than a doping concentration of the active regions.

5. The ESD device of claim 1, wherein a depth of the first well is different than a depth of the second well.

6. The ESD device of claim 1, wherein the second well has a bottom edge facing the substrate and wherein one of the active regions of the plurality of active regions interfaces with the bottom edge of the second well.

7. The ESD device of claim 1, wherein the first well is a p-well and the second well is an n-well.

8. An integrated circuit device comprising:
    at least two active regions on a substrate, the active regions being disposed between a first gate device and a second gate device; and
    at least one dummy gate disposed between the two active regions and between the first gate device and the second gate device;
    wherein the first gate device and the second device are positioned over a first well having a first conductivity type and the dummy gate is positioned over a second well having a second conductivity type.

9. The integrated circuit device of claim 8, wherein a first interface between the first well and the second well is positioned between the first gate device and the dummy gate and a second interface between the first well and the second well is positioned between the dummy gate and the second gate device.

10. The integrated circuit device of claim 8, wherein a first interface between the first well and the second well is vertically aligned with a sidewall of the first gate device that faces the dummy gate, and a second interface between the first well and the second well is vertically aligned with a sidewall of the second gate device that faces the dummy gate.

11. The integrated circuit device of claim 8, wherein a depth of the first well is different than a depth of the second well and the depth of the second well is different than a depth of the active regions.

12. The integrated circuit device of claim 8, wherein the second well extends to at least a portion of the at least one dummy gate.

13. The integrated circuit device of claim 8, wherein the first well is a p-well and the second well is an n-well.

14. The integrated circuit device of claim 8, wherein the first gate device and the second gate device run perpendicular to the active regions.

15. An integrated circuit device comprising:
    at least two gate devices, a dummy gate, and at least two active regions on a substrate, the active regions being positioned between a first one of the gate devices and the dummy gate device, wherein each active region is substantially uniform in length;
    wherein the first gate device is positioned over a first well having a first conductivity type and the dummy gate is positioned over a second well having a second conductivity type.

16. The integrated circuit device of claim 15, wherein the second well extends to the dummy gate.

17. The integrated circuit device of claim 15, further comprising a third well that is disposed under and interfacing with one of the active regions from the at least two active regions.

18. The method of claim 17, wherein the second well and the third well are separated from each other by the first well extending between and interfacing with the second and third wells.

19. The method claim 18, wherein the first well extends to a portion of the dummy gate.

20. The method of claim 15, wherein the first well is a p-well and the second well is an n-well with a shallower depth than the p-well.

* * * * *